United States Patent [19]
Suda

[11] Patent Number: 5,969,555
[45] Date of Patent: Oct. 19, 1999

[54] PULSE WIDTH FORMING CIRCUIT

[75] Inventor: Masakatsu Suda, Saitama, Japan

[73] Assignee: Advantest Corp., Tokyo, Japan

[21] Appl. No.: 09/063,281

[22] Filed: Apr. 20, 1998

[51] Int. Cl.[6] .................................................. H03K 3/017
[52] U.S. Cl. .......................................... 327/172; 327/176
[58] Field of Search ..................................... 327/172, 173, 327/174, 175, 176, 177, 291, 293, 294, 299

[56] References Cited

U.S. PATENT DOCUMENTS

| | | | |
|---|---|---|---|
| 4,077,010 | 2/1978 | Ryon | 328/20 |
| 5,055,706 | 10/1991 | Nakai et al. | 307/265 |
| 5,264,737 | 11/1993 | Oikawa | 307/265 |
| 5,396,110 | 3/1995 | Houston | 327/172 |
| 5,672,990 | 9/1997 | Chaw | 327/176 |
| 5,764,090 | 1/1998 | Yeh et al. | 327/174 |

Primary Examiner—Timothy P. Callahan
Assistant Examiner—Jeffrey Zweizig
Attorney, Agent, or Firm—Muramatsu & Associates

[57] ABSTRACT

An improved circuit for producing a pulse having a predetermined pulse width. The pulse width forming circuit includes a first delay element for receiving an input pulse and delaying the input pulse by a first delay time, an OR gate for receiving the input pulse at an input terminal and a first delayed pulse signal from the first delay element at another input terminal and adding the first delay time to a pulse width of the input pulse, a second delay element for receiving an output pulse of the OR gate and delaying the output pulse by a second delay time, and an AND gate for receiving the input pulse and a second delayed pulse signal from the second delay element for producing a pulse waveform having a predetermined pulse width whose starting edge corresponds to an end timing of the input pulse and whose stop edge corresponds to an end timing of the second delayed pulse signal.

17 Claims, 5 Drawing Sheets

PULSE WIDTH FORMING CIRCUIT

FIELD OF THE INVENTION

This invention relates to a pulse width forming circuit for producing a pulse signal of a predetermined pulse width, and more particularly, to a pulse width forming circuit which is able to generate pulse signals with high timing precision and accuracy as well as a small circuit scale and low cost.

BACKGROUND OF THE INVENTION

Pulse width forming circuits for generating pulse signals with a variety of pulse widths are used in many applications such as in a semiconductor test system. An example of such a pulse width forming circuit is shown in FIGS. 4A and 4B. FIG. 4A is a circuit diagram showing a configuration of the pulse width forming circuit and FIG. 4B is a timing chart showing the operation of the circuit of FIG. 4A. The pulse width forming circuit of FIG. 4A includes a pulse width integration circuit 30 and a pulse width differential circuit 45 connected in series.

The pulse width integration circuit 30 is formed of a first delay element 11 and an OR gate 13 to enlarge the pulse width of an incoming pulse signal. The pulse width integration circuit 30 receives an input pulse Pa of FIG. 4B(1) and produces a pulse Pb of FIG. 4B(2). The pulse Pb is produced by delaying the input pulse Pa by a first delay time D1 by the first delay element 11. At the output of the OR gate 13, the pulse width integration circuit 30 generates a pulse Pc shown in FIG. 4B(3) whose pulse width is integrated with the pulse width Pwa of the input pulse Pa and the delay time of the first delay element 11. Thus, a pulse width Pwc of the pulse Pc is the sum of the pulse width Pwa of the input pulse Pa and the first delay time D1.

The pulse width differential circuit 45 is formed of a second delay element 12 and an AND gate 14 to produce an output pulse having a predetermined pulse width. The pulse width differential circuit 45 receives the integrated pulse Pc of FIG. 4B(3) from the pulse width integration circuit 30 and produces a pulse Pd of FIG. 4B(4). The pulse Pd is produced by delaying the pulse Pc by a second delay time D2 by the second delay element 12. The pulse width differential circuit 45 generates an output pulse Pe shown in FIG. 4B(5) which starts at the falling edge of the pulse Pc and ends at the falling edge of the pulse Pd. The pulse width Pwe of the output pulse Pe is equal to the second delay time D2.

An example of the first and second delay elements 11 and 12 is a semiconductor gate circuit such as a CMOS gate whose propagation delay time can be controlled by a voltage supplied thereto. Another example of the delay elements is a passive circuit components such as a strip line or other signal transmission cables whose signal propagation delay times may be used as delay elements.

The conventional example in the foregoing has several disadvantages when used in the pulse width forming circuit. For example, to produce a desired pulse width based on the input pulse Pa of a small band width, the first delay element needs to have a relatively large delay time. However, the first delay time D1 must always smaller than the pulse width Pwa of the input pulse Pa to effectively enlarge the pulse width to produce the pulse Pc of FIG. 4B(3). Thus, the pulse width of the input pulse Pa must be greater than the delay time D1, which limits the range of pulse width of the input pulse Pa.

Further, the first delay time D1 is added to the pulse width Pwa of the input pulse Pa to produce the pulse Pc, and the start timing of the output pulse Pe is determined by the end timing of the pulse Pc. Thus, the delay time D1 affects the start timing of the output pulse Pe as shown in FIGS. 4B(3) and (5). Since delay time errors in such a delay element increase with the increase of the delay time, using the delay element having a relatively large delay time increases timing errors in the output pulse Pe.

In contrast, when the first delay time D1 is too small, the intended pulse width Pwe for the output pulse Pe may not be produced by the pulse width differential circuit 45. Such a case will occur when the sum of the delay time D1 and the pulse width Pwa of the input pulse Pa is smaller than the intended pulse width Pwe of the output pulse Pe, i.e., the second delay time D2. Thus, it is not practicable to use first delay element of too small delay time.

Another problem in the conventional pulse width formatting circuit of FIG. 4 is that there arises fluctuations in the output pulse timings. For example, since the delay elements 11 and 12 in FIG. 4A are typically formed of semiconductor devices such as CMOS gates, signal propagation times in such devices vary with the changes in the surrounding temperature, supply voltages, or the production process. For example, a signal propagation delay time of a typical CMOS gate fluctuates by a temperature of 0.3%/° C. and by a source voltage of 0.4%/10 mV.

In the conventional example shown in FIGS. 4A and 4B, the pulse Pb from the first delay element 11, i.e., the end timing of the pulse Pc determines the start timing of the output pulse Pe as noted above. Therefore, the start timing of the output pulse Pe will be fluctuated with the changes in the delay time D1 in the first delay element 11. The timing fluctuations of the output pulse Pe is inappropriate for the semiconductor test system in which timing pulses with high accuracy must be used to test semiconductor devices with high accuracy.

SUMMARY OF THE INVENTION

Therefore, it is an object of the present invention to provide a pulse width forming circuit which is capable of producing an output pulse having a predetermined pulse width with high timing accuracy.

It is another object of the present invention to provide a pulse width forming circuit which is capable of producing an output pulse having a relatively large pulse width even when a pulse width of an input pulse is small.

It is a further object of the present invention to provide a pulse width forming circuit which is capable of generating an output pulse having a predetermined pulse width with reduced number of circuit components and at low cost.

These and other objects and advantages are achieved, in accordance with embodiments of the present invention, in which a pulse width integration circuit and a pulse width differential circuit are incorporated in a specific manner to produce a predetermined pulse width.

The pulse width forming circuit of the present invention includes a first delay element for receiving an input pulse and delaying the input pulse by a first delay time, an OR gate for receiving the input pulse at an input terminal and a first delayed pulse signal from the first delay element at another input terminal and adding the first delay time to a pulse width of the input pulse, a second delay element for receiving an output pulse of the OR gate and delaying the output pulse by a second delay time, and an AND gate for receiving the input pulse and a second delayed pulse signal from the second delay element for producing a pulse waveform having a predetermined pulse width whose starting edge corresponds to an end timing of the input pulse and whose stop edge corresponds to an end timing of the second delayed pulse signal.

In another aspect of the present invention, the pulse width forming circuit has a plurality of pulse width integration circuits connected in series. The pulse width forming circuit includes a plurality of pulse width integration circuits connected in series, each of the pulse width integration circuits comprising a delay element for delaying an incoming pulse by a predetermined delay time and an OR gate for receiving the incoming pulse and a delayed pulse signal from the delay element and for adding the delay time to a pulse width of the incoming pulse, wherein an input pulse is received by a first stage of the plurality of pulse width integration circuits as the incoming pulse and an overall delayed pulse is produced at an output of a last stage of the plurality of pulse width integration circuits, and an AND gate for receiving the input pulse and the overall delayed pulse for producing a pulse waveform having a predetermined pulse width whose starting edge corresponds to an end timing of the input pulse and whose stop edge corresponds to an end timing of the overall delayed pulse.

As a result, in the pulse width forming circuit of the present invention, the pulse width of the output pulse is the sum of all of the delay times in the delay elements used therein. In the conventional example of FIG. 4, the pulse width of the output pulse Pe is equal to the delay time in the pulse width differential circuit. Therefore, the pulse width forming circuit of the present invention can produce a predetermined pulse by using a small number of circuit components, such as CMOS gates.

Further, in the present invention, the starting edge of the output pulse is produced at the timing of the falling edge of the input pulse unlike the conventional example of FIG. 4 wherein the starting edge is formed by the delay time in the pulse width integration circuit. Thus, the starting edge of the output pulse is not affected by the delay time variations caused by temperature or voltage changes. Consequently, the timing pulses of high accuracy can be generated by the pulse width forming circuit of the present invention. Moreover, by connecting a plurality of pulse width integration circuits in series, the pulse width forming circuit of the present invention is able to produce an output pulse having a relatively large pulse width even when a pulse width of an input pulse is small.

DETAILED DESCRIPTION OF THE PREFERRED EMBODIMENTS

Figure 1A:
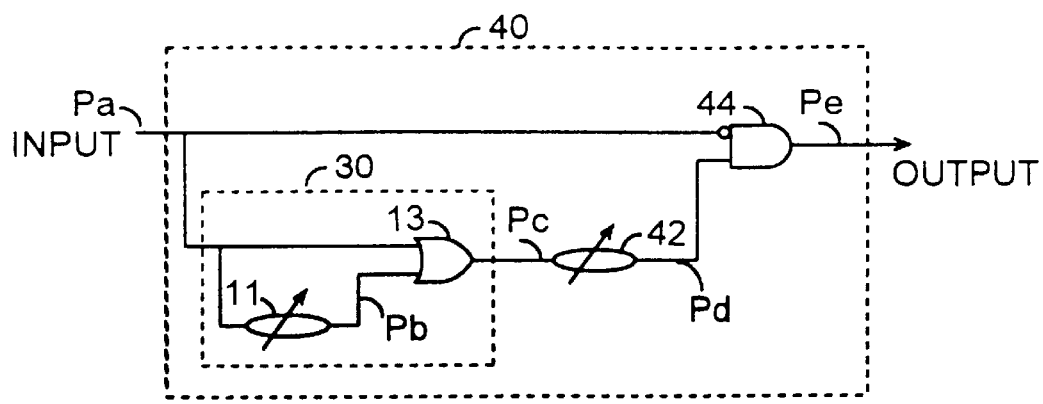
FIG. 1A is a circuit diagram showing an example of structure of the pulse width forming circuit of the present invention and FIG. 1B is a timing chart showing the operation of the pulse width forming circuit of FIG. 1A.
Figure 1B:
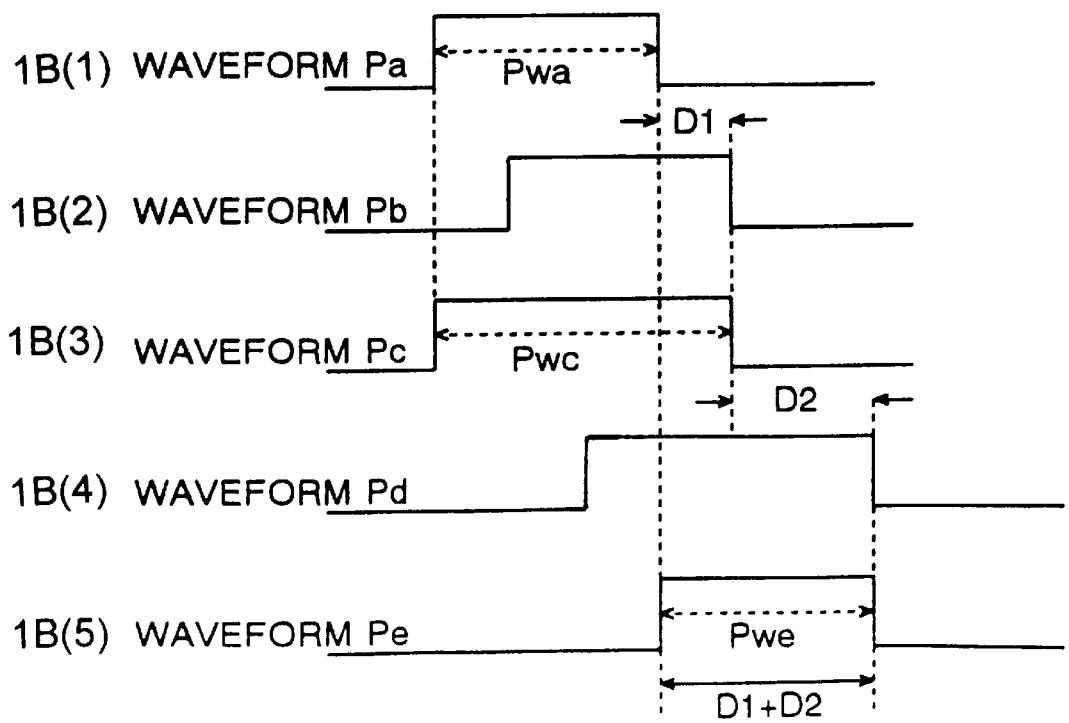

The first embodiment of the present invention is shown in FIGS. 1A and 1B where FIG. 1A is a circuit diagram showing an example of structure of the pulse width forming circuit of the present invention and FIG. 1B is a timing chart showing the operation of the pulse width forming circuit of FIG. 1A.

As shown in FIG. 1A, the pulse width forming circuit of the present invention includes a pulse width integration circuit 30 and a pulse width differential circuit 40. The pulse width integration circuit 30 has the same configuration as that of the conventional technology shown in FIG. 4A and is formed of a first delay element 11 and an OR gate 13 to enlarge the pulse width provided thereto. The pulse width differential circuit 40 includes therein the pulse width integration circuit 30 as well as a second delay element 42 and an AND gate 44 to form the pulse width. The pulse width integration circuit 30 is connected in series with the second delay element 42. In this arrangement of the present invention, each of the delay times D1 and D2 must be smaller than the pulse width Pwa of the input pulse Pa.

An input pulse Pa is provided to both the pulse width integration circuit 30 and the AND gate 44 of the pulse width differential circuit 40. When receiving the input pulse Pa of FIG. 1B(1), the pulse width integration circuit 30 produces a pulse Pb of FIG. 1B(2). The pulse Pb is produced by delaying the input pulse Pa by the first delay element 11 by a first delay time D1. At the output of the OR gate 13, the pulse width integration circuit 30 generates a pulse Pc shown in FIG. 1B(3) whose pulse width Pwc is integrated by the pulse width Pwa of the input pulse Pa and the delay time D1 of the first delay element 11.

The pulse Pc from the OR gate 13 is delayed by the second delay element 42 by the delay time D2. Thus, the AND gate 44 receives the pulse Pd of FIG. 1B(4) at its one input terminal. The other input terminal of the AND gate receives the input pulse Pa as shown in FIG. 1A. Since the input terminal of the AND gate receiving the input pulse Pa is inverted, an output pulse Pe is produced at the timing of the falling edge of the input pulse Pa as shown in FIG. 1B(5). The output pulse Pe has a pulse width Pwe which ends at the timing of the falling edge of the pulse Pd from the second delay element 42. Therefore, the pulse width Pwe is a sum of the delay time D1 and the delay time D2.

Figure 4A:
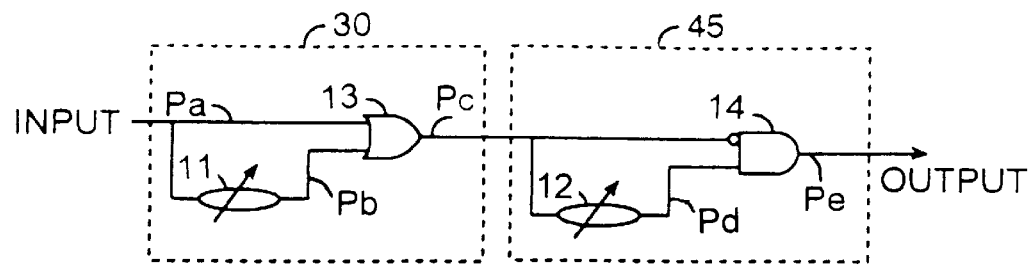
FIG. 4A is a circuit diagram showing a conventional example of structure of the pulse width forming circuit and FIG. 4B is a timing chart showing the operation of the pulse width forming circuit of FIG. 4A.
Figure 4B:
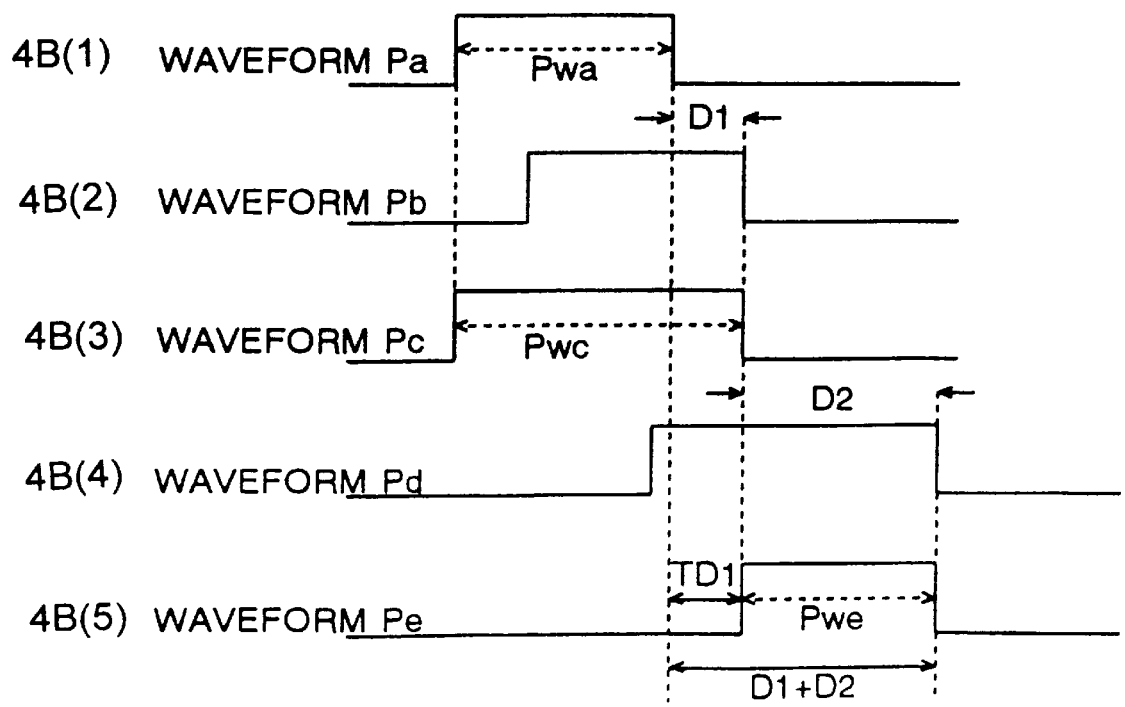

Unlike the example of FIGS. 4A and 4B wherein the pulse width of the output pulse Pe is equal to the delay time D2, one of the features of the present invention in FIGS. 1A and 1B is that the pulse width of the output pulse Pe is the sum of the delay times D1 and D2. Therefore, to produce the same amount of delay times, the present invention needs less circuit components, such as CMOS gates, than the conventional pulse width forming circuit to form the delay elements 11 and 42.

Another feature of the present invention resides in that the starting edge of the output pulse Pe is produced at the timing of the falling edge of the input pulse Pa as shown in FIG. 1B(S) unlike the conventional example of FIG. 4 wherein the starting edge is formed by the delay time D1. Thus, the starting edge of the output pulse Pe in FIG. 1B(5) is not affected by the delay time D1 of the delay element 11. Consequently, the timing pulses of high accuracy can be generated by the pulse width forming circuit of the present invention since the fluctuations of the delay time D1 due to the temperature or control voltage changes are not determinative of the start timing of the output pulse.

Figure 2A:
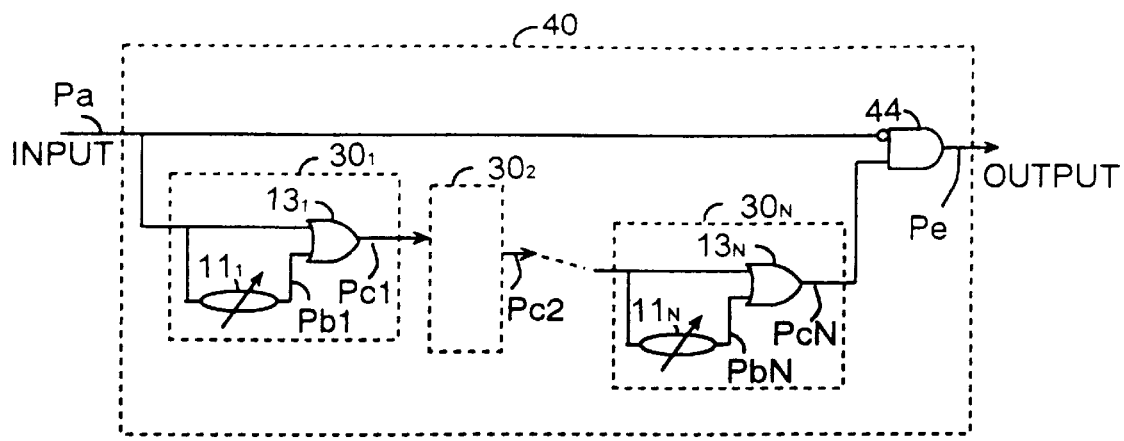
FIG. 2A is a circuit diagram showing an example of structure of another embodiment of the pulse width forming circuit of the present invention and FIG. 2B is a timing chart showing the operation of the pulse width forming circuit of FIG. 2A.
Figure 2B:
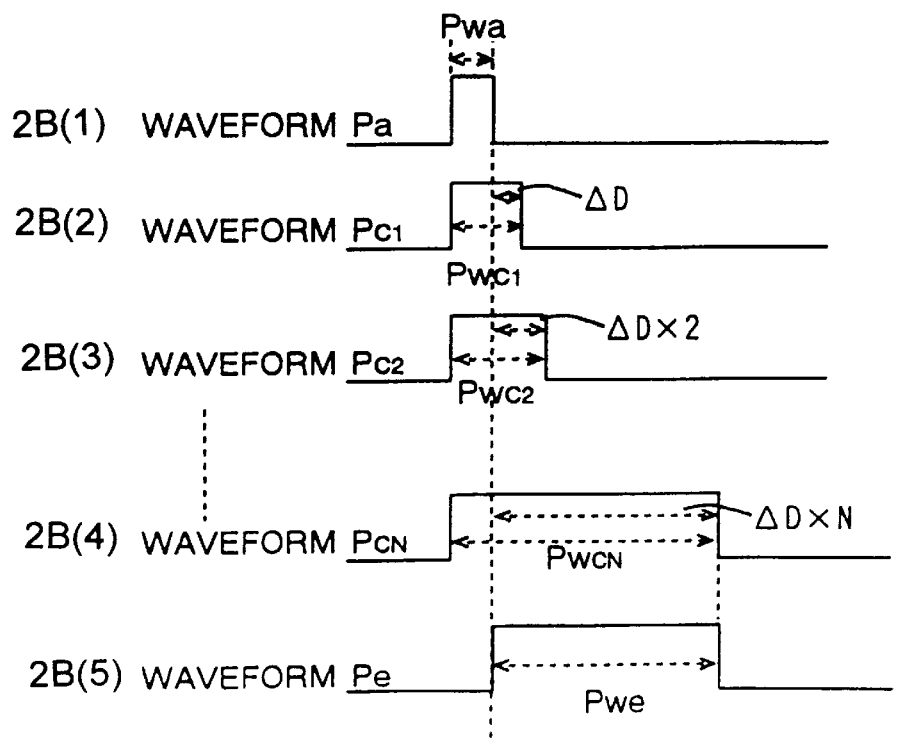

A second embodiment of the present invention is described with reference to FIGS. 2A and 2B wherein FIG. 2A is a circuit diagram showing an example of structure of the pulse width forming circuit and FIG. 2B is a timing chart showing the operation of the pulse width forming circuit of FIG. 2A. In this example, a plurality of pulse width integration circuits $30_1$—$30_N$ are series connected within the pulse width differential circuit 40.

The pulse width integration circuits $30_1$—$30_N$ include delay elements $11_1$—$11_N$, respectively, to produce delayed pulse signals $Pc_1$—$Pc_N$ at outputs of OR gates $13_1$—$13_N$, respectively. Each of the delay elements $11_1$—$11_N$ has a delay time of AD which is smaller than a pulse width of anticipated input pulse Pa. The pulse signal $Pc_N$ from the pulse width integration circuit $30N$ is fed to one input terminal of the AND gate 44. The pulse width of the pulse signal $Pc_N$ is enlarged by the sum of the delay times of the delay elements $11_1$—$11_N$ in the series connected integration circuits $30_1$—$30_N$, i.e., an overall delay time of N×ΔD.

In the example of FIG. 2, an input pulse Pa is provided to both the pulse width integration circuit $30_1$ and the AND gate 44 of the pulse width differential circuit 40. When receiving the input pulse Pa of FIG. 2B(1), the pulse width integration circuit $30_1$ produces a pulse $Pc_1$ of FIG. 2B(2) having a pulse width of $Pwc_1$. The pulse $Pc_1$ is produced at the output of the OR gate $13_1$ by adding a delay time ΔD to the pulse Pa by the delay element 111. Through a process similar to the above, at the output of the OR gate $13_2$, the pulse width integration circuit $30_2$ generates a pulse $Pc_2$ shown in FIG. 2B(3) whose pulse width $Pwc_2$ is further increased by the delay time ΔD.

Thus, at the pulse width integration circuit $30_N$, an output pulse $Pc_N$ from the OR gate $13_N$ is delayed by the sum of all of the delay times of the delay elements $11_1$—$11_N$, which is N times of the delay time AD. Thus, the AND gate 44 receives the pulse Pd of FIG. 2B(4) at its one input terminal. The other input terminal of the AND gate receives the input pulse Pa as shown in FIG. 2A. Since the input terminal of the AND gate receiving the input pulse Pa is inverted, an output pulse Pe is produced at the timing of the falling edge of the input pulse Pa as shown in FIG. 2B(5). The output pulse Pe has a pulse width Pwe which ends at the timing of the falling edge of the pulse $Pc_N$ from the pulse width integration circuit $30_N$. Therefore, the pulse width Pwe is equal to an overall delay time of ΔD×N.

Similar to the example of FIG. 1, the pulse width of the output pulse Pe is the sum of all of the delay times of the delay elements $11_1$—$11_N$. Therefore, to produce the same amount of delay times, the present invention of FIG. 2 needs less circuit components, such as CMOS gates, to form the delay elements $11_1$—$11_N$ than would need in the conventional approach of FIG. 4. Further, the starting edge of the output pulse Pe is produced at the timing of the falling edge of the input pulse Pa as shown in FIG. 2B(5). Thus, the starting edge of the output pulse Pe is not affected by the delay times ΔD of the delay elements 11. Consequently, the timing pulses of high accuracy can be generated by the pulse width forming circuit of the present invention since the fluctuations of the delay times AD due to the temperature changes or control voltage changes do not affect the start timing of the output pulse Pe.

Figure 3A:
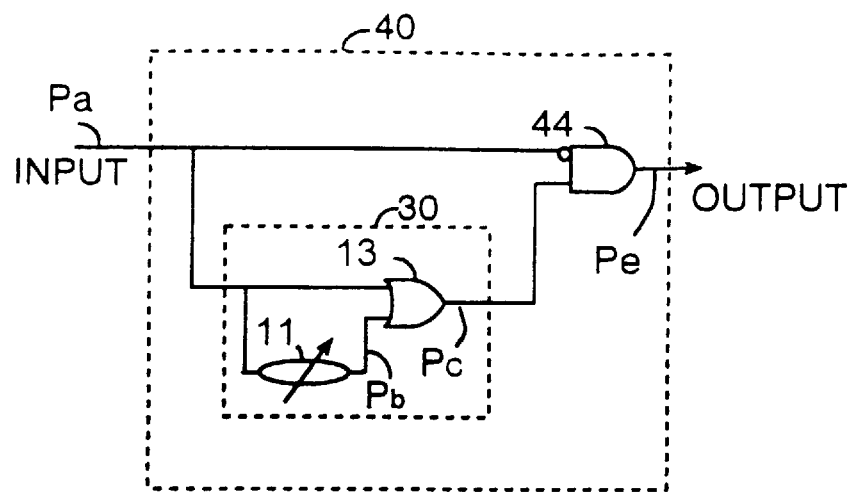
FIG. 3A is a circuit diagram showing an example of structure of another embodiment of the pulse width forming circuit of the present invention and FIG. 3B is a timing chart showing the operation of the pulse width forming circuit of FIG. 3A.
Figure 3B:
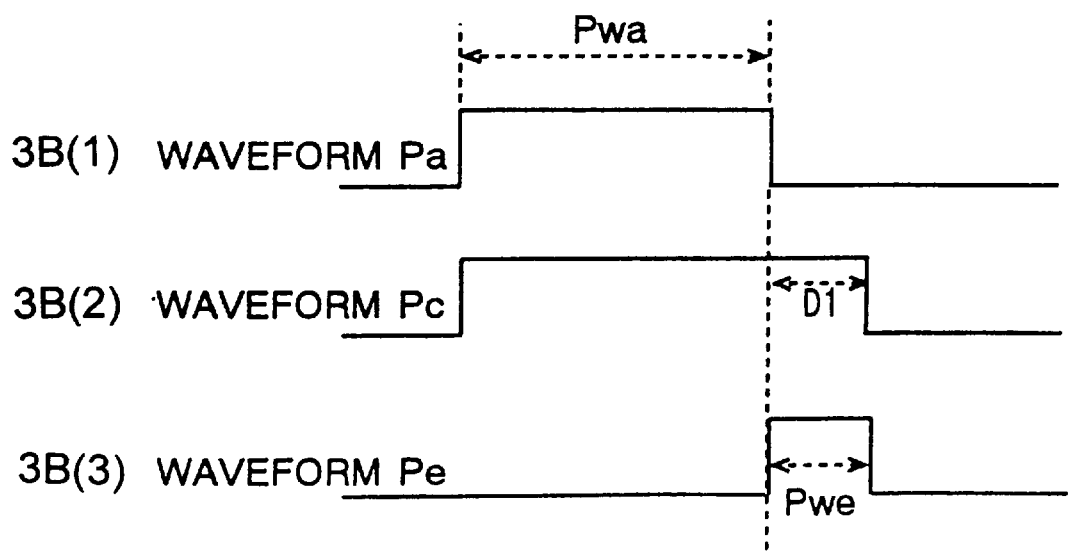

In case where a desired pulse width of the output pulse Pe is always smaller than the pulse width of the input pulse Pa, the circuit arrangement of the present invention can further simplified as shown in FIG. 3. FIG. 3A is a circuit diagram showing an example of structure of the pulse width forming circuit and FIG. 3B is a timing chart showing the operation of the pulse width forming circuit of FIG. 3A. In this example, an output of the pulse width integration circuit 30 is directly provided to the AND gate 44 of the pulse width differential circuit 40. Thus, the delay element 11 is a sole component for producing a delay time D1. The delay time D1 must be smaller than any anticipated pulse width of the input pulse Pa.

The input pulse Pa is provided to both the pulse width integration circuit 30 and the AND gate 44 in the pulse width differential circuit 40. When receiving the input pulse Pa of FIG. 3B(1), the pulse width integration circuit 30 produces a pulse Pc of FIG. 3B(2). The pulse Pc is produced by adding a delay time D1 to the input pulse Pa by the delay element 11. Thus, the AND gate 44 receives the pulse Pc at its one input terminal while the other input terminal of the AND gate receives the input pulse Pa. Since the input terminal of the AND gate receiving the input pulse Pa is inverted, an output pulse Pe starts at the timing of the falling edge of the input pulse Pa and ends at the timing of the falling edge of the pulse Pc as shown in FIG. 3B(3). Therefore, in this example, the pulse width Pwe is equal to the delay time D1.

Figure 5A:
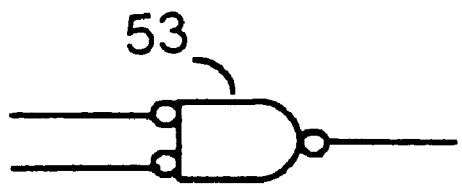
FIGS. 5A and 5B are circuit diagrams showing modification of gate circuits used in the pulse width forming circuit of the present invention.
Figure 5B:
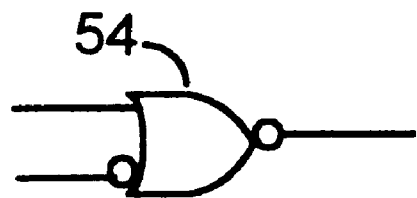

In the foregoing examples, the OR gate 13 in the pulse width integration circuit 30 can be replaced with an inverted input NAND gate 53 of FIG. 5A. Further, the AND gate 44 in the pulse width differential circuit 40 can be replaced with an inverted input NOR gate 54 of FIG. 5B. Further in the foregoing examples, although the operations of the present invention are explained based on the positive logic, it is obvious that the circuit arrangement can be formed based on negative logic as well.

In the conventional example of FIG. 4, the pulse width of the output pulse Pe is equal to the delay time D2 in the pulse width differential circuit. However, in the pulse width forming circuit of the present invention, the pulse width of the output pulse is the sum of all of the delay times in the delay elements used therein. Therefore, pulse width forming circuit can produce a predetermined pulse by using a small number of circuit components, such as CMOS gates or transmission lines.

Further, in the present invention, the starting edge of the output pulse is produced at the timing of the falling edge of the input pulse unlike the conventional example of FIG. 4 wherein the starting edge is formed by the delay time in the pulse width integration circuit. Thus, the starting edge of the output pulse is not affected by the delay time variations caused by temperature or voltage changes. Consequently, the timing pulses of high accuracy can be generated by the pulse width forming circuit of the present invention. Moreover, by connecting a plurality of pulse width integration circuits in series, the pulse width forming circuit of the present invention is able to produce an output pulse having a relatively large pulse width even when a pulse width of an input pulse is small.

What is claimed is:

1. A pulse width forming circuit, comprising:
   a first delay element for receiving an input pulse and delaying said input pulse by a first delay time;
   summing means for receiving said input pulse and a first delayed pulse signal from said first delay element and adding said first delay time to a pulse width of said input pulse;
   a second delay element for receiving an output pulse of said summing means and delaying said output pulse by a second delay time; and
   gate means for receiving said input pulse and a second delayed pulse signal from said second delay element for producing a pulse waveform having a predetermined pulse width whose starting edge corresponds to an end timing of said input pulse and whose stop edge corresponds to an end timing of said second delayed pulse signal.

2. A pulse width forming circuit as defined in claim 1 wherein said predetermined pulse width is equal to a sum of said first delay time and said second delay time, and said first delay time is smaller than said pulse width of said input pulse.

3. A pulse width forming circuit as defined in claim 1 wherein each of said first and second delay elements is formed of CMOS gates.

4. A pulse width forming circuit as defined in claim 1 wherein each of said first and second delay elements is formed of signal transmission lines.

5. A pulse width forming circuit, comprising:
a first delay element for receiving an input pulse and delaying said input pulse by a first delay time;
an OR gate for receiving said input pulse at an input terminal and a first delayed pulse signal from said first delay element at another input terminal and adding said first delay time to a pulse width of said input pulse;
a second delay element for receiving an output pulse of said summing means and delaying said output pulse by a second delay time; and
an AND gate for receiving said input pulse and a second delayed pulse signal from said second delay element for producing a pulse waveform having a predetermined pulse width whose starting edge corresponds to an end timing of said input pulse and whose stop edge corresponds to an end timing of said second delayed pulse signal.

6. A pulse width forming circuit as defined in claim 5 wherein said predetermined pulse width is equal to a sum of said first delay time and said second delay time, and said first delay time is smaller than said pulse width of said input pulse.

7. A pulse width forming circuit as defined in claim 5 wherein each of said first and second delay elements is formed of CMOS gates.

8. A pulse width forming circuit as defined in claim 5 wherein each of said first and second delay elements is formed of signal transmission lines.

9. A pulse width forming circuit, comprising:
a plurality of pulse width integration circuits connected in series, each of said pulse width integration circuits comprising;
a delay element for delaying an incoming pulse by a predetermined delay time;
summing means for receiving said incoming pulse and a delayed pulse signal from said delay element and adding said delay time to a pulse width of said incoming pulse;
wherein an input pulse is received by a first stage of said plurality of pulse width integration circuits as said incoming pulse and an overall delayed pulse is produced at an output of a last stage of said plurality of pulse width integration circuits; and
gate means for receiving said input pulse and said overall delayed pulse for producing a pulse waveform having a predetermined pulse width whose starting edge corresponds to an end timing of said input pulse and whose stop edge corresponds to an end timing of said overall delayed pulse.

10. A pulse width forming circuit as defined in claim 9 wherein said predetermined pulse width is equal to a sum of all of said delay times of said delay elements in said plurality of pulse integration circuits, and said delay time in each of said plurality of pulse width integration circuit is smaller than a pulse width of said input pulse.

11. A pulse width forming circuit as defined in claim 9 wherein each of said delay elements is formed of CMOS gates.

12. A pulse width forming circuit as defined in claim 1 wherein each of said delay elements is formed of signal transmission lines.

13. A pulse width forming circuit, comprising:
a plurality of pulse width integration circuits connected in series, each of said pulse width integration circuits comprising;
a delay element for delaying an incoming pulse by a predetermined delay time;
an OR gate for receiving said incoming pulse and a delayed pulse signal from said delay element and adding said delay time to a pulse width of said incoming pulse;
wherein an input pulse is received by a first stage of said plurality of pulse width integration circuits as said incoming pulse and an overall delayed pulse is produced at an output of a last stage of said plurality of pulse width integration circuits; and
an AND gate for receiving said input pulse and said overall delayed pulse for producing a pulse waveform having a predetermined pulse width whose starting edge corresponds to an end timing of said input pulse and whose stop edge corresponds to an end timing of said overall delayed pulse.

14. A pulse width forming circuit as defined in claim 13 wherein said predetermined pulse width is equal to a sum of all of said delay times of said delay elements in said plurality of pulse integration circuits, and said delay time in each of said plurality of pulse width integration circuit is smaller than a pulse width of said input pulse.

15. A pulse width forming circuit as defined in claim 13 wherein each of said delay elements is formed of CMOS gates.

16. A pulse width forming circuit as defined in claim 13 wherein each of said delay elements is formed of signal transmission lines.

17. A pulse width forming circuit, comprising:
a delay element for receiving an input pulse and delaying said input pulse by a predetermined delay time;
an OR gate for receiving said input pulse at an input terminal and a delayed pulse signal from said delay element at another input terminal and for adding said delay time to a pulse width of said input pulse; and
an AND gate for receiving said input pulse and an output pulse of said OR gate for producing a pulse waveform having a predetermined pulse width whose starting edge corresponds to an end timing of said input pulse and whose stop edge corresponds to an end timing of said output pulse of said OR gate.

* * * * *